United States Patent [19]
Kuo et al.

[11] Patent Number: 5,715,528
[45] Date of Patent: Feb. 3, 1998

[54] CONVERTING CAPACITANCE TO INDUCTANCE IN A FLOATING RESONANT

[75] Inventors: Yao Hsien Kuo, West Bloomfield, Mich.; Howard Graeme Roberts, Ilford, England; Edmund Joe Tillo, II, Belleville; John Francis Kennedy, Dearborn, both of Mich.

[73] Assignee: Ford Motor Company, Dearborn, Mich.

[21] Appl. No.: 598,753

[22] Filed: Feb. 8, 1996

[51] Int. Cl.$^6$ .................................................. H04B 1/18
[52] U.S. Cl. .................. 455/142; 455/144; 455/180.4; 455/188.1; 455/191.2; 455/197.3; 334/71
[58] Field of Search ........................... 455/142, 143, 455/180.1, 180.4, 188.1, 191.2, 193.1, 197.3, 197.2, 197.1, 144; 381/4; 334/15, 55, 56, 71; 331/181, 179

[56] References Cited

U.S. PATENT DOCUMENTS

| | | |
|---|---|---|
| 3,519,939 | 7/1970 | Tashima . |
| 3,526,859 | 9/1970 | Pützer . |
| 3,582,791 | 6/1971 | Slavin . |
| 3,624,514 | 11/1971 | Putzer . |
| 3,659,206 | 4/1972 | Cooke et al. ................ 325/445 |
| 4,061,981 | 12/1977 | Endres et al. . |
| 4,065,723 | 12/1977 | Endres et al. . |
| 4,628,540 | 12/1986 | Hendriks . |
| 4,710,973 | 12/1987 | Suzuki . |
| 5,239,699 | 8/1993 | Ecklund ........................ 455/142 |

FOREIGN PATENT DOCUMENTS

| | | |
|---|---|---|
| 1354392A | 6/1964 | France . |
| 2622054A | 4/1979 | France . |
| 1291389B | 3/1969 | Germany . |

OTHER PUBLICATIONS

European Search Report, May 21, 1997.

*Primary Examiner*—Andrew Faile
*Assistant Examiner*—Christopher Onuaku
*Attorney, Agent, or Firm*—Mark L. Mollon; Roger L. May

[57] ABSTRACT

An improved tuner for a varactor-tuned local oscillator in a radio receiver includes a winding of a pair of magnetically coupled inductors, preferably constructed in the form of a transformer. Preferably, the first and second windings are magnetically coupled with reduced inter-winding capacitance by axially separating the windings on a common core. The second winding is selectively coupled by a switch to a capacitive load in order to change the inductance of the first winding. The tuning range of the resonant circuit formed by the varactor diode set and the first winding is changed when the capacitive load is coupled. The magnetic coupling between the transformer windings provides DC isolation between the oscillator and the switching circuit. Preferably, a tuning actuator has overlapping ranges of movement for selection of a signal within both the AM and FM frequency bands as the intermediate frequencies for the local oscillator are generated.

16 Claims, 2 Drawing Sheets

5,715,528

CONVERTING CAPACITANCE TO INDUCTANCE IN A FLOATING RESONANT

TECHNICAL FIELD

The present invention relates generally to radio receivers with a tunable local oscillator that receives multiple bands of signals and, more particularly, to such a tunable local oscillator having at least two inductors in the form of a set of coupled coils and switched capacitive load.

BACKGROUND ART

Audio reproduction systems often include a radio receiver adapted to receive multiple bands of radio signals. For example, a radio receiver may receive both AM 540 KHz to 1710 KHz and FM 87 MHz to 108 band signals as a signal source for audio reproduction. Accordingly, a local oscillator must tune from 97.7 MHz to 118.7 MHz in order to cover FM signals from 87 MHz to 108 MHz with a 10.7 Mhz intermediate frequency. In addition, a local oscillator must tune from 11.2 MHz to 12.4 MHz in order to cover AM signals from 540 KHz to 1710 KHz, and with a 10.7 MHz intermediate frequency. Conventionally, many production audio entertainment systems include separate local oscillators for each of these ranges, contributing substantial cost and complexity to the audio system.

To avoid such duplication of components, a single local oscillator may be tuned over multiple ranges for reception of AM and FM band signals. Conventional design techniques suggest one approach in which the local oscillator can tune from 97.7 MHz to 124.1 MHz, a range of 27.4 MHz, to cover both bands. For AM reception, the 112.4 MHz to 124.1 MHz signals band of the local oscillator is switched to a divider to divide the frequencies by a factor of 10 to obtain a 10.7 MHz intermediate frequency. Tuning for each band is accomplished with a varactor diode set. The difficulty with this approach is that the larger frequency range means that a reduced portion of the varactor diodes' tuning range is used for each band, resulting in increased susceptibility to noise on the varactor diodes' tuning line due to a high gain scope (MHz/volt) of the tuning line.

Another approach to designing a single local oscillator is to use two coils in the local oscillator tank circuit, each coil having a different inductance. The coils are alternatively switched into the circuit for reception of the AM or FM band signals. When separate inductors are used, the capacitance of the varactor diodes used to tune the local oscillator can be made to vary over its full range for each band, and thereby reduce the gain scope (MHz/volt) and the effects of noise present on the tuning line of the varactor diode set. Unfortunately, this development increases the number of parts in the coil selection mechanism and increases the losses in the local oscillator tank circuit because many losses are associated with a switching circuit in the high current loop of a parallel resonant circuit. In addition, such a circuit does not provide DC isolation of the switching circuit form the oscillator circuit.

Another conventional approach would involve adding a second varactor diode set to the tuning network acting as a switchable padder capacitor. The structure allows each tuning varactor diode set to operate throughout its their full range, but additional losses are associated with the padder diodes which reduce the oscillator tank Q.

SUMMARY OF THE PRESENT INVENTION

The present invention overcomes the above-mentioned disadvantages by providing a tuning circuit for selecting the tuning range of a varactor-tuned local oscillator by using a set of coupled coils and a selectively applied capacitive load on one of the windings. In such a circuit, changing the value of the capacitive load on one winding results in an apparent change in inductance on the other winding, thus producing the same effect as switching two different coils for changing the tuning the range available with a single varactor diode set. Since the coefficient of magnetic coupling among the coils is less than one, the current in the loop that includes the capacitive load and the switch is lower than the current in the other winding. Accordingly, a lower current in the switching loop leads to reduced $I^2R$ power losses in the switch and the capacitive load, as compared to switching two inductors in and out of a tuning loop carrying a high current. As a result, this tuner maintains a high tank circuit Q. In addition, the magnetic coupling between the coils provides DC isolation between the oscillator and the switching circuits. As a result, the present invention provides better electrical performance and reduced costs over previously known approaches for tuning a single local oscillator or using multiple local oscillators in radio receivers.

The present invention provides a tuning circuit for radio receivers including a varactor-tuned local oscillator with a resonant tank circuit including a set of coupled coils and a selectively applied capacitive load in accordance with the present invention. In addition, the present invention provides a method for receiving radio signals in multiple bands of radio signals by tuning a resonant tank circuit with coupled inductors and a capacitive load applied to one of the windings. In addition, the present invention provides a radio receiver with a high Q tank circuit for selecting the band to be applied to the varactor tuning circuit for a local oscillator that provides both AM and FM reception, preferably in overlapping ranges of an actuator for varactor tuning control.

BRIEF DESCRIPTION OF THE DRAWINGS

The present invention will be more clearly understood by reference to the following detailed description of a preferred embodiment when read in conjunction with the accompanying drawing in which like reference characters refer to like parts throughout the views and in which.

DETAILED DESCRIPTION OF THE PREFERRED EMBODIMENT

Figure 1:
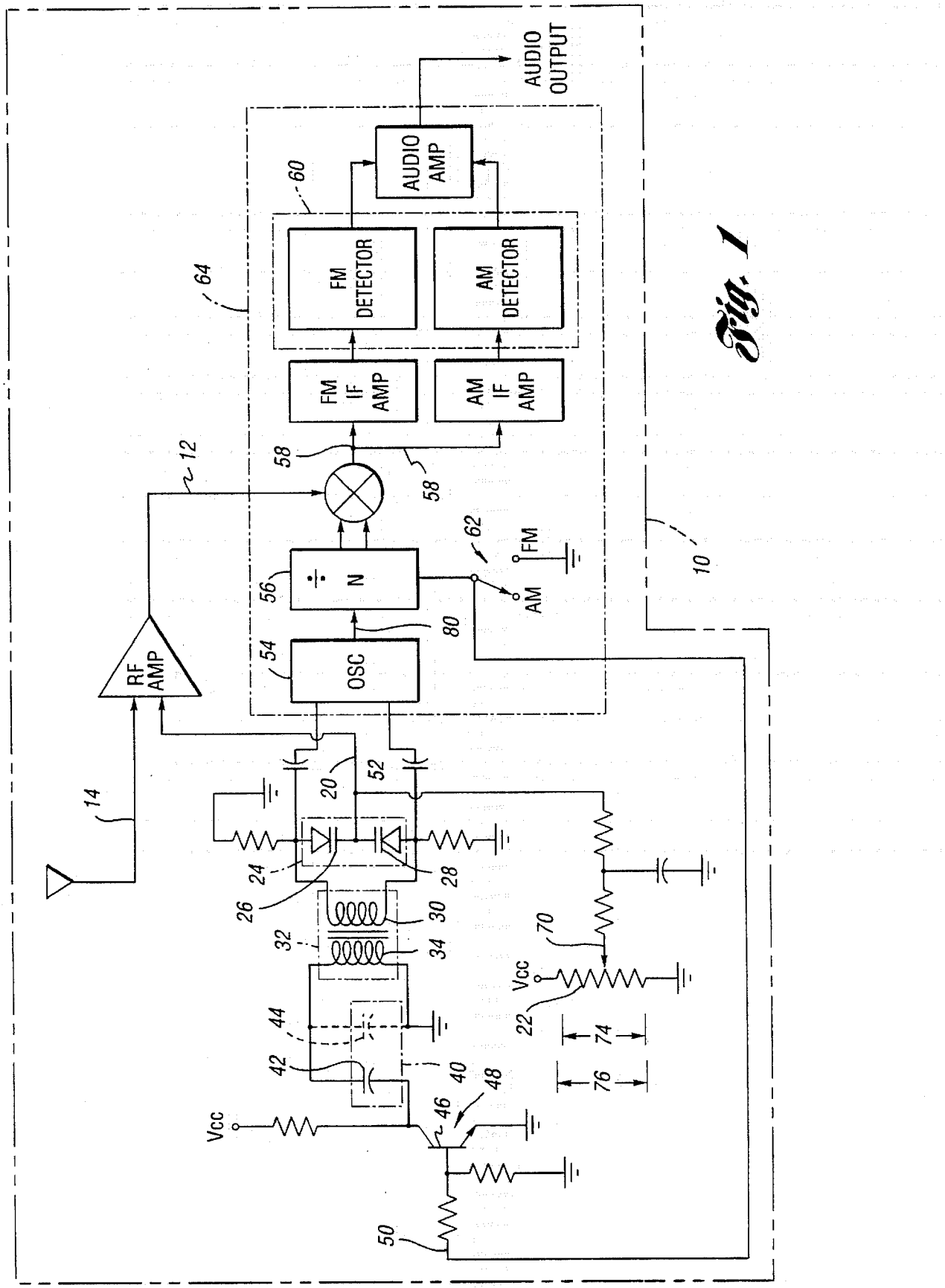
FIG. 1 is a schematic and partly diagrammatic view of a radio receiver system with the tuning circuit constructed according to the present invention.

Referring first to FIG. 1, the radio receiver system 10 according to the present invention is shown comprising the front end 12 adapted to receive the signal from antenna 14 for generation of appropriate intermediate frequency signal to the signal detector for eventual reproduction of an audio signal representative of information signals received at the antenna 14. The front end 12 includes a tuning input 20, for example, a rotation knob potentiometer 22, that enables the user to particularly select the signal whose information is to be audibly reproduced within a selected band of radio signals. The voltage control 22 governs the operation of the varactor tuning circuit 24.

Figure 4:
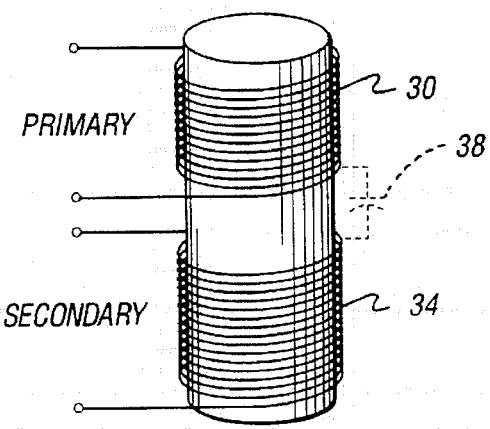
FIG. 4 is a diagrammatic representation of a preferred transformer construction for a tuner constructed in accordance with the present invention.

The tuning circuit 24 comprises a set of varactor diodes 26 and 28 coupled in a tank circuit configuration with an inductor. The inductor comprises a first winding 30 of the coupled coils 32 having a second winding 34. Preferably, as shown in FIG. 4, the windings 30 and 34 are magnetically coupled by a common core. In addition, the windings 30 and 34 are preferably axially spaced apart so that a reduced capacitance, represented diagrammatically at 38 in FIG. 4, is induced by the coupling between the windings 30 and 34 and avoids the increased capacitance that would occur if the windings were overlapping.

A circuit loop for the winding 34 includes a capacitive load 40, for example, a selected load capacitor 42, and an intrinsic physical implementation capacitance 44 representative of stray capacitance in the circuit from the winding 34 to ground. The capacitive load 42 is applied to a winding 34 by a switch 46. The switch 46, preferably a transistor 48 that is preferably switched on by application of a signal 50, is actuated in response to a user's manipulation of an AM-FM selector switch 62.

The change in input impedance 52, that is input to the IC 64 that forms the local oscillator, may generally be characterized as a decrease in inductance when the capacitive load 42 is coupled to the winding 34. This effect may be represented by the equation:

$$Z_n(j\omega) = j\omega L_1 - j\omega \frac{m^2}{L_2} \left( \frac{1}{1 - \frac{\omega_0^2}{\omega^2}} \right), \quad (1)$$

where:

$$\omega_0 = \frac{1}{\sqrt{L_2 C}}. \quad (2)$$

where $\omega$ is a selected measurement frequency input, for example, 130 MHz. $\omega_0$ is the resonant frequency of the loop formed by coil 34 and the capacitive load 40, $L_1$ is the inductance of the winding 30, $L_2$ is the inductance of the winding 34, and m is the mutual inductance among windings 30 and 34.

Figure 2A:
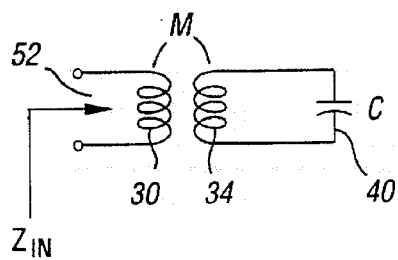
FIGS. 2a and 2b are schematic representations of the performance of the tank circuit constructed in accordance with the present invention.
Figure 2B:
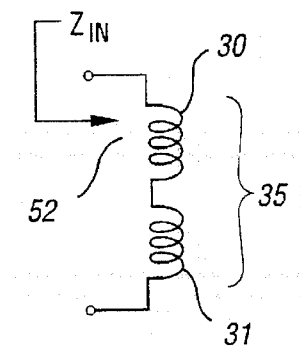

Accordingly, it will be understood that the effect of capacitance in the circuit loop with the second winding 34 is to increase the apparent inductance 35 of coupled coils 32 when the received signal is below the resonant frequency of the resonant circuit combining winding 34 with capacitive load 40. This effect simulates the addition of an inductance 31 as shown in FIG. 2B. Likewise, capacitance 40 reduces the apparent inductance 35 when the signal frequency is above the resonant frequency and effects a subtraction of an inductance 31. Each of these effects are shown schematically in FIG. 2, and the functional effect of coupling the load capacitor 42 in and out is graphically represented in FIG. 3.

Figure 3:
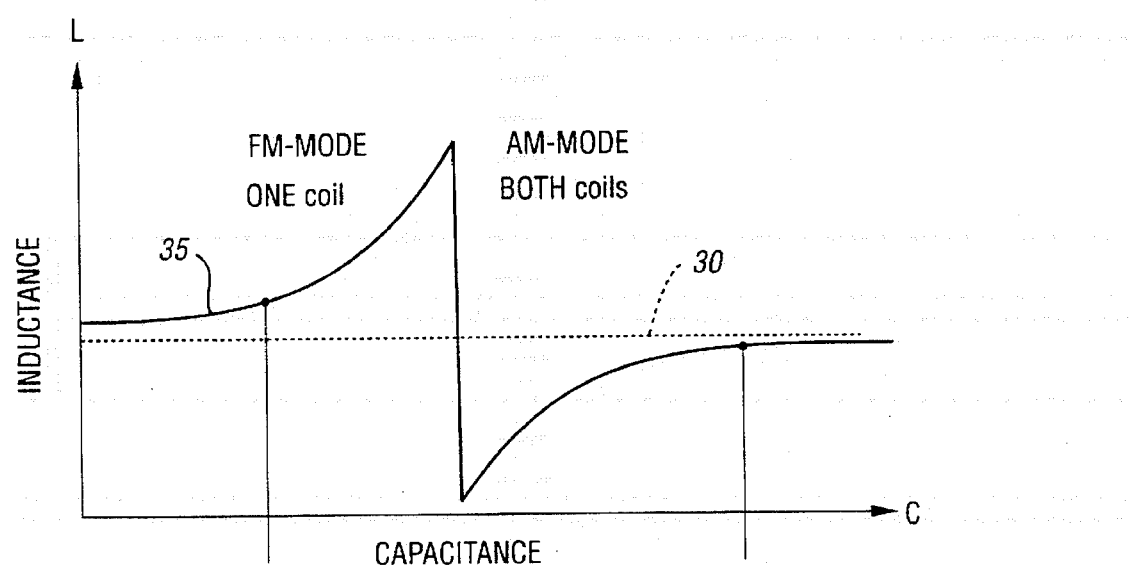
FIG. 3 is a graphic representation of the tuning performance shown in FIG. 2.

FIG. 3 shows the apparent inductance 35 applied at terminals 52, the primary terminals of a set of magnetically coupled coils, as a function of load capacitance 40, comprised of capacitances 42 and 44, measured at a fixed frequency. The inductance coupled to terminals 52 is larger when load capacitor 42 is switched out, as compared to when it is switched in.

FIG. 3 shows the inductance measured under varying capacitive load conditions with the measurement frequency held constant. If there is no capacitance whatsoever present in the circuit 40, the inductance measured is that of the winding 30 alone. This inductance is shown by the horizontal dotted line in FIG. 3. Equations (1) and (2) show the effect of having no capacitance for 40 when C is equal to zero. When C is zero, the value of $\omega_0$ is infinity, as shown in Equation (2). When this value is substituted into Equation (1), the second term becomes zero, resulting in an inductive impedance seen at terminals 52 is simply $j\omega L$.

Further examination of FIG. 3 shows that the resonant point for the circuit comprised of the secondary winding 34 and the load capacitance 40, occurs in the middle of the capacitive load range shown in FIG. 3 at the fixed frequency where the measurements were made. Notice that when the load capacitance is only 44, i.e., when the switch 46 is open, the apparent inductance measured at terminals 52 is higher than that of winding 30 alone. The inductance is higher because the resonant frequency of the tank comprised of the winding 34 and capacitive load 44 is higher than the measurement frequency. This can be seen in Equation (1), when $\omega_0$ is greater than $\omega$. When this condition is true, the denominator of the second term is negative, resulting in inductance being added to $L_1$.

When load 42 is switched in, the resonant frequency of the tank circuit, comprised of the winding 34 and load capacitance 44+42, is lowered. In fact, the resonant frequency of the tank circuit lowered below the measurement frequency, and the apparent inductance measured at terminals 52 is lower than the inductance of winding 30 alone. The lowered inductance can also be seen by examining Equation (1). When $\omega_0$ is less than $\omega$, the denominator of the second term is net positive, which results in inductance being subtracted from $L_1$.

As a result, the local oscillator is tuned for FM reception when the capacitive load 42 is not applied to the winding 34. Likewise, the local oscillator is tuned for AM reception when the capacitive load 42 is applied to the winding 34. As a result, the tuner limits the local oscillator frequency range to between 97.7 MHz to 118.7 MHz when the capacitive load 42 is not applied to the winding 34. In contrast, when the capacitive load 42 is applied to the winding 34, the local oscillator frequency range is limited to between 112.4 MHz to 124.1 MHz. This is the range for AM radio reception.

As best shown in FIG. 1, the output of the local oscillator 54 is sent to a frequency divider 56. The frequency division ratio is selected to be either 1 or 10 by actuation of the AM-FM selector switch 62 that provides the signal 50 to operate switch 46 in tuning circuit 24. In the preferred embodiment, the local oscillator output 80 in the range of 97.7 MHz to 118.7 MHz is divided by one for reception of FM signals. The local oscillator output 80 in the range of 112.4 MHz and 124.1 MHz would be divided by 10 in order to provide an appropriate intermediate frequency, for example, 10.7 MHz output 58 to a signal detector 60. In the preferred embodiment, the FM IF amplifier and detector are separated from the AM IF amplifier and detector for convenience in using different bandwidth crystals in the detector circuit 60.

Referring again to FIG. 1, the inductors and capacitors are preferably selected to provide an overlapping range of movement on an actuator 70 to be used with the tuner 20. For example, as shown in FIG. 1, the rotary potentiometer 22 includes the knob 72 that is rotatable through a first range of movement 74 for FM reception and has a range of movement overlapping with a second range of displacement 76 used in tuning the receiver for AM reception. The overlapping portion of the ranges of movement substantially simplifies the tuning activity required by the radio user. The degree of overlap is expanded throughout the range of varactor tuning by using the switched inductance without the disadvantages of switching high current inductors. The overlap is substantially increased compared to use of a single inductor tunable across the entire 98 MHz to 124 MHz range.

Having thus described the present invention, many modifications thereto will become apparent to those skilled in the art to which it pertains without departing from the scope and spirit of the present invention as defined in the appended claims.

What is claimed is:

1. An improved tuning circuit for radio receivers, comprising:

a vatactor-tuned local oscillator;

a tuning circuit for said oscillator comprising a set of at least two magnetically coupled coils having a first winding and a second winding; and one of said first and second windings being directly coupled in said local oscillator, the other of said first and second windings having a circuit loop including a capacitive load and a switch for coupling said capacitive load to said one winding, and thereby adjusting the inductance of the other winding.

2. The invention as defined in claim 1 wherein said first and second windings comprise primary and secondary windings wound on a common core.

3. The invention as defined in claim 2 wherein said primary and secondary windings are axially spaced along said common core.

4. The invention described in claim 1 wherein said switch comprises a transistor.

5. The invention as described in claim 1 and further comprising a frequency divider.

6. A method for receiving radio signals in multiple bands of radio signals, comprising:

tuning a local oscillator for a received signal with a resonant circuit having a varactor diode set with a voltage control and having an inductor for a first band of signals; and re-tuning said resonant circuit for reception of a second band of signals by magnetically coupling a second inductor to said first inductor and connecting a capacitive load upon said second inductor in a circuit loop out of said resonant circuit.

7. The invention as defined in claim 6 wherein said tuning step comprises installing a first winding of a transformer having first and second windings in said resonant circuit.

8. The invention as defined in claim 7 wherein said re-tuning step comprises switching a capacitive load upon said second winding of said transformer for reception of a second band of said multiple bands.

9. The invention as defined in claim 8 wherein said switching step comprises adding capacitance to said second winding to reduce the effective inductance of said first winding.

10. The invention as defined in claim 8 wherein said switching step comprises adding capacitance to said second winding to increase the effective inductance of said first winding.

11. The invention as defined in claim 6 wherein said voltage control comprises an actuator having a range of movement, and wherein said oscillator tuning step comprises moving said actuator in an overlapping portion of said range of movement for each of said first and second bands.

12. The invention as defined in claim 6 and further comprising frequency dividing one of said first and second band signals.

13. A radio receiver, comprising:

an antenna for receiving transmitted radio signals;

a super-heterodyne receiver circuit coupled to said antenna for amplifying said radio signal and generating an intermediate frequency;

a signal detector including a multiplexer for generating a multiplex signal in response to said intermediate frequency signal, and an audio processor for developing an audio output from said multiplex signal to be delivered to an audio transducer;

wherein said receiver circuit includes a front end circuit comprising a single oscillator and an adjustable tuner for reception of first and second band of signals, said tuner comprising a transformer having first and second magnetically coupled windings, said first winding coupled in a controlled resonant circuit for inputting a selected frequency signal of first band of signals to said oscillator and said second winding coupled through a switch to a capacitive load out of said resonant circuit for adjusting the inductance coupled to said tuner control for inputting a selected frequency of a second band of signals to said oscillator.

14. The inventions as defined in claim 13 wherein said first and second windings are wound on a common core.

15. The invention as defined in claim 14 wherein said first and second windings are axially spaced along said core.

16. The invention as defined in claim 13 wherein said super-hetrodyne receiver circuit includes a frequency divider for adjusting the band coupled to said multiplexer.

* * * * *